US012710696B2

(12) United States Patent
Kano et al.

(10) Patent No.: US 12,710,696 B2
(45) Date of Patent: Aug. 18, 2026

(54) FLEXOGRAPHIC PRINTING PLATE PRECURSOR

(71) Applicant: FUJIFILM Corporation, Tokyo (JP)

(72) Inventors: Kenji Kano, Haibara-gun (JP); Masato Shirakawa, Haibara-gun (JP); Kazuki Watanabe, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 574 days.

(21) Appl. No.: 18/362,585

(22) Filed: Jul. 31, 2023

(65) Prior Publication Data

US 2023/0375926 A1 Nov. 23, 2023

Related U.S. Application Data

(63) Continuation of application No. PCT/JP2022/004288, filed on Feb. 3, 2022.

(30) Foreign Application Priority Data

Feb. 5, 2021 (JP) ................................ 2021-017222
Aug. 31, 2021 (JP) ................................ 2021-141203

(51) Int. Cl.
*G03F 7/033* (2006.01)
*B41N 1/12* (2006.01)

(52) U.S. Cl.
CPC ............... *G03F 7/033* (2013.01); *B41N 1/12* (2013.01)

(58) Field of Classification Search
CPC . G03F 7/033; G03F 7/027; G03F 7/38; G03F 7/00; G03F 7/004; B41N 1/12

(Continued)

(56) References Cited

U.S. PATENT DOCUMENTS

2021/0165322 A1* 6/2021 Sato ........................ G03F 7/037
2021/0356865 A1 11/2021 Namba et al.

(Continued)

FOREIGN PATENT DOCUMENTS

JP 2015-102641 A 6/2015
WO 2020/090978 A1 5/2020
WO 2020/158778 A1 8/2020

OTHER PUBLICATIONS

International Search Report dated Apr. 26, 2022 in Application No. PCT/JP2022/004288.

(Continued)

*Primary Examiner* — Caleen O Sullivan
(74) *Attorney, Agent, or Firm* — Sughrue Mion, PLLC

(57) ABSTRACT

An object of the present invention is to provide a flexographic printing plate precursor which exhibits excellent rear end ink receptivity and microcell reproducibility in a case of being used for a flexographic printing plate. The flexographic printing plate precursor of the present invention includes a support and a photosensitive layer disposed above the support, in which all of the following conditions A and B are satisfied.

Condition A: in a case where R=(Ef/Eb)×(t−0.6)/0.54, a value of R is 12 or more and 30 or less, Condition B: Ef is 5,000 or more, Here, Eb is a back exposure amount (unit: mJ/square centimeter), and refers to an exposure amount at which a relief depth is 600 μm, Ef is a main exposure amount (unit: mJ/square centimeter), and refers to an exposure amount at which a difference in height between an end part as a convex portion and a central part as a concave portion in a case of forming an image area consisting of a 200 μm convex thin line reaches 4 μm, and (Continued)

t refers to a thickness of the flexographic printing plate precursor from a bottom surface of the support to a surface of the photosensitive layer.

20 Claims, 1 Drawing Sheet

(58) Field of Classification Search
USPC .................... 430/270.1, 271.1, 272.1, 273.1
See application file for complete search history.

(56) References Cited

U.S. PATENT DOCUMENTS

2022/0314679 A1* 10/2022 Yoshimoto .............. B41N 1/12
2022/0314680 A1* 10/2022 Yoshimoto ............. G03F 7/031

OTHER PUBLICATIONS

Written Opinion of the International Searching Authority dated Apr. 26, 2022 in Application No. PCT/JP2022/004288.
International Preliminary Report on Patentability dated Aug. 3, 2023 in Application No. PCT/JP2022/004288.
Communication dated Jan. 20, 2026 issued by the Japanese Patent Office in application No. 2022- 579605.
Communication dated Jun. 30, 2026, in Japanese Application No. 2022-579605.

* cited by examiner

FLEXOGRAPHIC PRINTING PLATE PRECURSOR

CROSS-REFERENCE TO RELATED APPLICATIONS

This application is a Continuation of PCT International Application No. PCT/JP2022/004288 filed on Feb. 3, 2022, which claims priority under 35 U.S.C. § 119(a) to Japanese Patent Application No. 2021-017222 filed on Feb. 5, 2021 and Japanese Patent Application No. 2021-141203 filed on Aug. 31, 2021. The above applications are hereby expressly incorporated by reference, in their entirety, into the present application.

BACKGROUND OF THE INVENTION

1. Field of the Invention

The present invention relates to a flexographic printing plate precursor.

2. Description of the Related Art

In recent years, various industries have started to reduce the use of organic solvents from the viewpoint of improving the working environment and preserving the global environment, and in a plate making step of a photosensitive flexographic printing plate used for printing, the use of an aqueous developable photosensitive resin plate is increasing.

For example, claim 1 of WO2020/090978 Å discloses a flexographic printing plate precursor which exhibits excellent rear end ink receptivity (referring to a performance to suppress occurrence of white spots at a rear end part of an image; the same applies hereinafter) in a case of being used for a flexographic printing plate.

SUMMARY OF THE INVENTION

In a case of studying on the water-developable flexographic printing plate precursor disclosed in WO2020/090978A, it has been confirmed that the rear end ink receptivity is excellent, but on the other hand, reproducibility of microcells (fine concave-convex structure with a depth of 10 μm or less) formed on a surface of a photosensitive layer is insufficient from the viewpoint of increasing density of a printed article.

Therefore, in view of the above-described circumstances, an object of the present invention is to provide a flexographic printing plate precursor which exhibits excellent rear end ink receptivity and microcell reproducibility in a case of being used for a flexographic printing plate.

As a result of intensive studies on the above-described problems, the present inventors have found that a flexographic printing plate precursor, in which a back exposure amount Eb at which a relief depth is 600 μm and an exposure amount Ef at which a difference in height between an end part as a convex portion and a central part as a concave portion in a case of forming an image area consisting of a 200 μm convex thin line reaches 4 μm satisfy certain condition ranges, exhibits excellent rear end ink receptivity and microcell reproducibility in a case of being used for a flexographic printing plate, and have completed the present invention.

That is, the present inventors have found that the above-described objects can be achieved by the following configurations.

[1] A flexographic printing plate precursor comprising:

a support; and a photosensitive layer disposed above the support, in which the photosensitive layer contains at least water-dispersible particles, a binder, a monomer, a photopolymerization initiator, and a polymerization inhibitor, and the flexographic printing plate precursor satisfies all of the following conditions A and B, Condition A: in a case where $R=(Ef/Eb)\times(t-0.6)/0.54$, a value of R is 12 or more and 30 or less, Condition B: Ef is 5,000 or more, here, Eb is a back exposure amount (unit: mJ/square centimeter), and refers to an exposure amount at which a relief depth is 600 μm, Ef is a main exposure amount (unit: mJ/square centimeter), and refers to an exposure amount at which a difference in height between an end part as a convex portion and a central part as a concave portion in a case of forming an image area consisting of a 200 μm convex thin line reaches 4 μm, and t refers to a thickness of the flexographic printing plate precursor from a bottom surface of the support to a surface of the photosensitive layer.

[2] The flexographic printing plate precursor according to [1], in which, in a case where a content (% by mass) of the monomer contained in the photosensitive layer is denoted as M and a content (% by mass) of the photopolymerization initiator contained in the photosensitive layer is denoted as I, the following condition C is satisfied, $$15\leq M\times I^{1/2}\leq 28. \quad \text{Condition C:}$$

[3] The flexographic printing plate precursor according to [1] or [2], in which the value of R indicated by the condition A is 16 or more and 30 or less.

[4] The flexographic printing plate precursor according to any one of [1] to [3], in which a value of Ef indicated by the condition B is 7,300 or more.

[5] The flexographic printing plate precursor according to any one of [1] to [4], in which the binder contains at least one type of non-fluid rubber.

[6] The flexographic printing plate precursor according to [5], in which the non-fluid rubber is at least one selected from the group consisting of natural rubber, isoprene rubber, butadiene rubber, styrene butadiene rubber, butyl rubber, and ethylene-propylene rubber.

[7] The flexographic printing plate precursor according to any one of [1] to [6], in which the binder contains at least one type of thermoplastic elastomer.

[8] The flexographic printing plate precursor according to any one of [1] to [7], in which the water-dispersible particles are composed of a polymer obtained by polymerizing at least one monomer selected from the group consisting of isoprene, butadiene, styrene, butyl, ethylene, propylene, acrylic acid ester, and methacrylic acid ester.

[9] The flexographic printing plate precursor according to any one of [1] to [8], in which a content of the polymerization inhibitor is 0.01% by mass or more.

[10] The flexographic printing plate precursor according to any one of [1] to [9], in which a content of the polymerization inhibitor is 0.01% by mass or more and 0.5% by mass or less.

As described above, according to the present invention, it is possible to provide a flexographic printing plate precursor which exhibits excellent rear end ink receptivity and micro-cell reproducibility in a case of being used for a flexographic printing plate.

DESCRIPTION OF THE PREFERRED EMBODIMENTS

Hereinafter, the present invention will be described in detail.

The description of configuration requirements described below may be made on the basis of representative embodiments of the present invention, but it should not be construed that the present invention is limited to those embodiments.

In this specification, the numerical range expressed by using "to" means a range including the numerical values before and after "to" as the lower limit value and the upper limit value.

In addition, each component may be used alone or in combination of two or more thereof. Here, in a case where two or more kinds are used in combination for each component, a content with regard to the component indicates the total content thereof, unless otherwise specified.

In addition, "(meth)acryl" represents a notation of "acryl" or "methacryl", "(meth)acrylate" represents a notation of "acrylate" or "methacrylate", and "(meth)acryloyl" represents a notation of "acryloyl" or "methacryloyl".

[Water-Developable Flexographic Printing Plate Precursor]

The flexographic printing plate precursor according to the embodiment of the present invention (hereinafter, also abbreviated as "printing plate precursor according to the embodiment of the present invention") is a flexographic printing plate precursor including a support and a photosensitive layer disposed above the support.

In addition, the above-described photosensitive layer contains at least water-dispersible particles, a binder, a monomer, a photopolymerization initiator, and a polymerization inhibitor.

In addition, the printing plate precursor according to the embodiment of the present invention is a flexographic printing plate precursor satisfying all of the following conditions A and B.

Condition A: in a case where $R=(Ef/Eb)\times(t-0.6)/0.54$, a value of R is 12 or more and 30 or less, Condition B: Ef is 5,000 or more.

Here,

Eb is a back exposure amount (unit: mJ/square centimeter), and refers to an exposure amount at which a relief depth is 600 μm, Ef is a main exposure amount (unit: mJ/square centimeter), and refers to an exposure amount at which a difference in height between an end part as a convex portion and a central part as a concave portion in a case of forming an image area consisting of a 200 μm convex thin line reaches 4 μm, and t refers to a thickness of the flexographic printing plate precursor from a bottom surface of the support (that is, a surface of the support opposite to the photosensitive layer) to a surface of the photosensitive layer (that is, a surface of the photosensitive layer opposite to the support).

Figure 1:
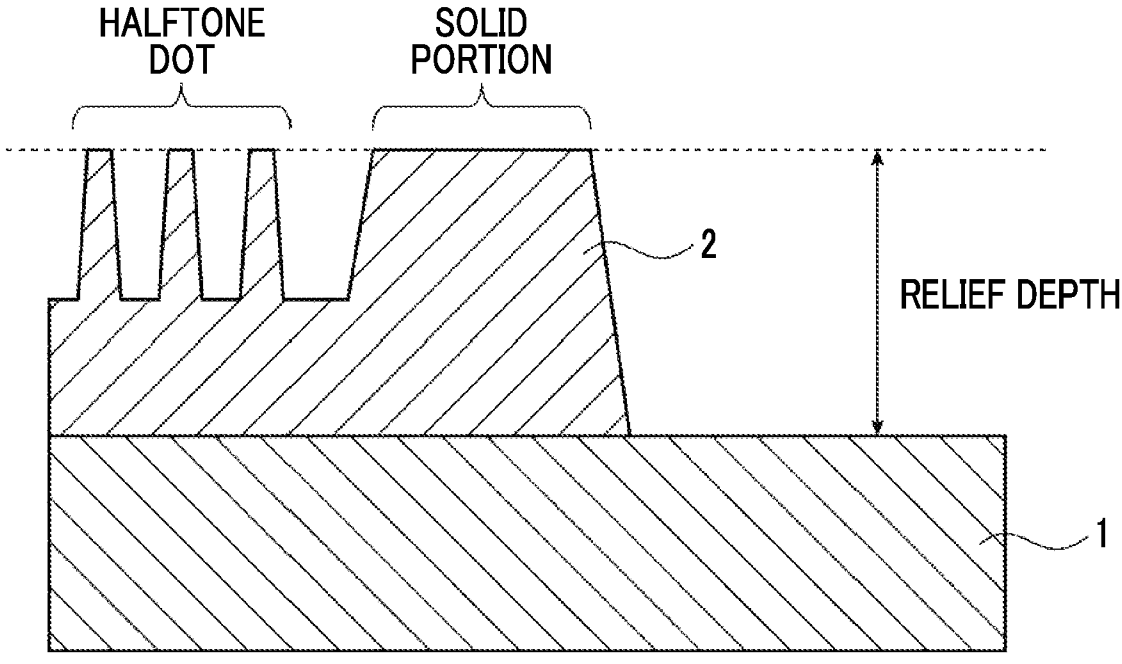
FIG. 1 is a schematic cross-sectional view for explaining a relief depth.

Here, regarding Eb, the relief depth refers to a height from a surface (surface of a floor area) which appears after the flexographic printing plate precursor is developed to a surface of the flexographic printing plate, that is, a height of an image area. Specifically, as shown in FIG. 1, the relief depth refers to a height from a surface of a floor area 1 to a surface of an image area 2 in a flexographic printing plate after development.

Therefore, Eb refers to an exposure amount which cures the floor area by a back exposure so that a height of an area which is to be the image area in a main exposure performed later is set to 600 μm.

In the present invention, the relief depth can be calculated as a difference between overall film thickness and a floor area film thickness, which is obtained by measuring, using a dial gauge, the entire film thickness (overall film thickness) of the flexographic printing plate and a film thickness (floor area film thickness) from the support to the floor area.

Figure 2:
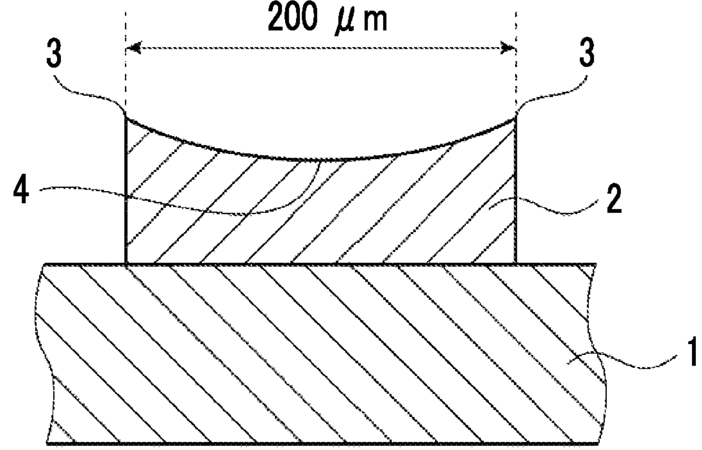
FIG. 2 is a schematic cross-sectional view for explaining a convex portion and a concave portion of an image area consisting of a 200 μm convex thin line.

In addition, regarding Ef, as shown in FIG. 2, with respect to a convex thin line 2 having a line width of 200 μm as an image area formed on the surface of the floor area 1, reference numeral 3 represents an end part and reference numeral 4 represents a concave portion.

In the present invention, as the difference in height between the end part as the convex portion and the central part as the concave portion in a case of forming the image area consisting of the 200 μm convex thin line, using a hybrid laser microscope OPTELICS (registered trademark) HYBRIDE (manufactured by Lasertec Corporation), a confocal measurement is performed in increments of 0.1 μm in height with a 50× Apo objective lens (high numerical aperture (high NA)), and the difference in height can be obtained from three-dimensional data. Specifically, a region of 150 μm in a line direction (longitudinal direction) is measured on a surface of the convex thin line having a line width of 200 μm, and an average value of three-dimensional information (height data) of the surface of the convex thin line is calculated. Thereafter, among the calculated average values of three-dimensional information, an average value (average height profile) in the line direction (longitudinal direction) of the convex thin line is subjected to moving averaging processing in a width direction of the convex thin line, and a moving average value is obtained at intervals of 2 μm in the width direction of the convex thin line to create a profile. The difference in height is obtained from a difference between an end part (maximum value) and a central part (minimum value) in the created profile. The calculation of the average value is performed in two regions, and the average value of the difference in height calculated from each region is defined as the "difference in height between the end part as the convex portion and the central part as the concave portion in a case of forming the image area consisting of the 200 μm convex thin line".

The printing plate precursor according to the embodiment of the present invention is a flexographic printing plate precursor satisfying all of the above-described conditions A and B, but the above-described conditions A and B does not limit the mode of development of the printing plate precursor. That is, in the printing plate precursor according to the embodiment of the present invention, in a case of manufacturing a printing plate, it is not necessary to perform a back side exposure at an exposure amount of the "exposure amount at which the relief depth is 600 μm", and an image area other than the "200 μm convex thin line" may be formed by the main exposure and development.

In the present invention, from the reason of exhibiting more excellent microcell reproducibility, the value of R indicated by the above-described condition A is preferably 16 or more and more preferably 16 or more and 30 or less.

In the present invention, from the reason of exhibiting more excellent microcell reproducibility, the value of Ef indicated by the above-described condition B is preferably 7,000 or more, more preferably 7,300 or more, and still more preferably 7,300 or more and 10,000 or less.

In the present invention, a method for adjusting the above-described conditions A and B is not particularly limited, but it can be adjusted by a formulating amount of components (particularly, the monomer, the photopolymerization initiator, and the polymerization inhibitor) contained in the photosensitive layer of the printing plate precursor according to the embodiment of the present invention.

Hereinafter, each layer configuration included in the flexographic printing plate precursor according to the embodiment of the present invention will be described in detail.

[Support]

A material used for the support included in the flexographic printing plate precursor according to the embodiment of the present invention is not particularly limited, and a support with high dimensional stability is preferably used. Examples thereof include metals such as steel, stainless steel, and aluminum; polyester (for example, polyethylene terephthalate (PET), polybutylene terephthalate (PBT), polyethylene naphthalate (PEN), polyimide (PI), poly amide, liquid crystal polymer (LCP), and polyacrylonitrile (PAN)); plastic resins such as polyvinyl chloride; synthetic rubber such as styrene-butadiene rubber; glass fiber reinforced plastic resin (such as epoxy resin and phenolic resin); and cloth and paper.

From the viewpoint of dimensional stability and availability, the support is preferably a polymer film or cloth, and more preferably a polymer film. The morphology of the support is determined by whether the polymer layer is sheet-like or sleeve-like.

As the cloth, plain or twill weave fabrics and various knitted fabrics of natural fibers such as cotton, linen, silk, and wool or synthetic fibers such as acetate, vinylon, vinylidene, polyvinyl chloride, acrylic, polypropylene, polyethylene, polyurethane, fluorine filament, polyclar, rayon, nylon, polyamide, and polyester, or nonwoven fabrics can be used.

Examples of the polymer film include a film formed of various polymers such as polyester (for example, polyethylene terephthalate (PET), polybutylene terephthalate (PBT), polyethylene naphthalate (PEN), polyimide (PI), polyamide, liquid crystal polymer (LCP), and polyacrylonitrile (PAN)), plastic resins such as polyvinyl chloride, synthetic rubber such as styrene-butadiene rubber, and glass fiber reinforced plastic resin (such as epoxy resin and phenolic resin). Among these, from the viewpoint of dimensional stability and the like, a polyester film is preferable.

Examples of the above-described polyester film include a PET film, a PBT film, and a PEN film, and from the viewpoint of dimensional stability and the like, a polyethylene terephthalate (PET) film is preferable.

A film thickness of the support is not particularly limited, but from the viewpoint of dimensional stability and handleability, it is preferably 5 to 3,000 μm, more preferably 50 to 2,000 μm, and still more preferably 100 to 1,000 μm.

[Photosensitive Layer]

The photosensitive layer included in the printing plate precursor according to the embodiment of the present invention contains water-dispersible particles, a binder, a monomer, a photopolymerization initiator, and a polymerization inhibitor.

Hereinafter, each component contained in the photosensitive layer will be described.

<Water-Dispersible Particles>

The water-dispersible particles are not particularly limited, but from the reason that rear end ink receptivity and microcell reproducibility of a flexographic printing plate to be obtained are more excellent, the water-dispersible particles are preferably a polymer. Hereinafter, the "rear end ink receptivity and microcell reproducibility are more excellent" is also referred to as "the effects of the present invention are more excellent".

Specific examples of the above-described polymer include diene-based polymers (for example, polybutadiene, natural rubber, styrene-butadiene copolymer, acrylonitrile-butadiene copolymer, methyl methacrylate-butadiene copolymer, polychloroprene, and polyisoprene), polyurethane, vinylpyridine polymer, butyl polymer, thiokol polymer, acrylate polymer, and a polymer obtained by copolymerizing these polymers with other components such as acrylic acid and methacrylic acid. These may be used alone or in combination of two or more.

From the reason that water-based ink resistance is more excellent, the above-described polymer is preferably a polymer obtained by polymerizing at least one monomer selected from the group consisting of isoprene, butadiene, styrene, butyl, ethylene, propylene, acrylic acid ester, and methacrylic acid ester, and more preferably polybutadiene.

It is preferable that the above-described polymer does not have a reactive functional group (for example, a (meth) acryloyloxy group) at both terminals.

From the reason that the effects of the present invention are more excellent, the above-described polymer is a polymer obtained by removing water from water-dispersible latex. Specific examples of the above-described water-dispersible latex include water-dispersible latex of specific examples of the above-described polymer.

From the reason that the effects of the present invention are more excellent, a content of the water-dispersible particles is preferably 5% to 80% by mass, more preferably 10% to 60% by mass, and still more preferably 20% to 45% by mass with respect to the total mass of solid content in the photosensitive layer.

<Binder>

The binder is not particularly limited, and examples thereof include a thermoplastic polymer.

The thermoplastic polymer is not particularly limited as long as the thermoplastic polymer is a polymer exhibiting thermoplasticity, and specific examples thereof include a polystyrene resin, a polyester resin, a polyamide resin, a polysulfone resin, a polyethersulfone resin, a polyimide resin, an acrylic resin, an acetal resin, an epoxy resin, a polycarbonate resin, rubbers, and a thermoplastic elastomer. These may be used alone or in combination of two or more.

Among these, from the reason that an elastic and flexible film can be easily formed, a rubber or a thermoplastic elastomer is preferable, a rubber is more preferable, and a diene-based rubber is still more preferable.

As the above-described rubber, in order to secure elasticity of the flexographic plate, a non-fluid rubber which does not have fluidity is preferable. Therefore, it is preferable that the binder contains at least one type of non-fluid rubber.

Specific examples of the non-fluid rubber include natural rubber, butadiene rubber (BR), nitrile rubber (NBR), acrylic rubber, epichlorohydrin rubber, urethane rubber, isoprene rubber, styrene isoprene rubber, styrene butadiene rubber (SBR), butyl rubber, ethylene-propylene rubber, and chlorinated polyethylene. These may be used alone or in combination of two or more.

Among these, from the reason that water developability is improved, or from the viewpoint of drying properties and image reproducibility, at least one rubber selected from the group consisting of butadiene rubber, styrene butadiene rubber, and nitrile rubber is preferable.

In addition, from the viewpoint of water-based ink resistance, butadiene rubber or styrene butadiene rubber is preferable.

In addition, from the reason that strength against indentation deformation of the relief during printing increases, at least one selected from the group consisting of natural rubber, isoprene rubber, butadiene rubber, styrene butadiene rubber, butyl rubber, and ethylene-propylene rubber is preferable.

From the reason that manufacturing suitability is improved, the above-described binder preferably contains at least one type of thermoplastic elastomer.

Examples of the thermoplastic elastomer include a polybutadiene-based thermoplastic elastomer (PB), a polyisoprene-based thermoplastic elastomer, a polyolefin-based thermoplastic elastomer, and an acrylic thermoplastic elastomer. Specific examples thereof include polystyrene-polybutadiene (SB), polystyrene-polybutadiene-polystyrene (SBS), polystyrene-polyisoprene-polystyrene (SIS), polystyrene-polyethylene/polybutylene-polystyrene (SEBS), acrylonitrile butadiene styrene copolymer (ABS), acrylic acid ester rubber (ACM), acrylonitrile-chlorinated polyethylene-styrene copolymer (ACS), acrylonitrile-styrene copolymer, syndiotactic 1,2-polybutadiene, and methyl polymethacrylate-butyl polyacrylate-methyl polymethacrylate. Among these, from the reason that water developability is improved, or from the viewpoint of drying properties and image reproducibility, PB, SBS, or SIS is particularly preferable.

A content of the binder is preferably 1% to 50% by mass, more preferably 5% to 40% by mass, and still more preferably 7% to 30% by mass with respect to the total mass of solid content in the photosensitive layer.

<Monomer>

The monomer is not particularly limited, but from the reason that the effects of the present invention are more excellent, it is preferable to use a monofunctional monomer and a bifunctional monomer in combination.

(Monofunctional Monomer)

From the reason that the effects of the present invention are more excellent, the above-described monofunctional monomer is preferably a compound having one ethylenically unsaturated group.

Examples of the ethylenically unsaturated group include a radically polymerizable group such as an acryloyl group, a methacryloyl group, a vinyl group, a styryl group, and an allyl group, and among these, an acryloyl group, a methacryloyl group, or $C(O)OCH{=}CH_2$ is preferable, and an acryloyl group or a methacryloyl group is more preferable.

Examples of the compound having one ethylenically unsaturated group include

N-vinyl compounds such as N-vinylformamide;

(meth)acrylamide compounds such as (meth)acrylamide, N-methylol (meth)acrylamide, diacetone (meth)acrylamide, N,N-dimethyl (meth)acrylamide, N,N-diethyl (meth)acrylamide, N-isopropyl (meth)acrylamide, (meth)acryloylmorpholine, and (meth)acrylamide;

(meth)acrylate compounds such as 2-hydroxyethyl (meth) acrylate, butoxyethyl (meth)acrylate, carbitol (meth) acrylate, cyclohexyl (meth)acrylate, tetrahydrofurfuryl (meth)acrylate, benzyl (meth)acrylate, tridecyl (meth) acrylate, 2-phenoxyethyl (meth)acrylate, glycidyl (meth)acrylate, isobornyl (meth)acrylate, dicyclopentenyl (meth)acrylate, dicyclopentenyloxyethyl (meth) acrylate, dicyclopentanyl (meth)acrylate, 2-hydroxy-3-phenoxypropyl (meth)acrylate, 2-(meth)) acryloyloxyethyl phthalate, methoxy-polyethylene glycol (meth)acrylate, 2-(meth)acryloyloxyethyl-2-hydroxyethyl phthalate, 2-(2-ethoxyethoxy)ethyl (meth) acrylate, 2-methoxyethyl (meth)acrylate, 3-methoxybutyl (meth)acrylate, ethoxylated phenyl (meth)acrylate, 2-(meth)acryloyloxyethyl succinic acid, nonylphenol EO-adduct (meth)acrylate, phenoxy-polyethylene glycol (meth)acrylate, 2-(meth)acryloyloxyethylhexahydrophthalic acid, lactone-modified (meth)acrylate, stearyl (meth)acrylate, isoamyl (meth) acrylate, isomyristyl (meth)acrylate, isostearyl (meth) acrylate, and cyclic trimethylolpropane formal (meth) acrylate; and monovinyl ether compounds such as methyl vinyl ether, ethyl vinyl ether, n-propyl vinyl ether, isopropyl vinyl ether, n-butyl vinyl ether, isobutyl vinyl ether, t-butyl vinyl ether, n-octadecyl vinyl ether, 2-ethylhexyl vinyl ether, n-nonyl vinyl ether, dodecyl vinyl ether, octadecyl vinyl ether, cyclohexyl vinyl ether, cyclohexyl methyl vinyl ether, 4-methylcyclohexyl methyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethyl cyclohexyl methyl vinyl ether, diethylene glycol monovinyl ether, polyethylene glycol vinyl ether, chlorethyl vinyl ether, chlorobutyl vinyl ether, chloroethoxyethyl vinyl ether, phenylethyl vinyl ether, phenoxypolyethylene glycol vinyl ether, cyclohexanedimethanol monovinyl ether, and isopropenyl ether-O-propylene carbonate.

EO represents ethylene oxide.

From the reason that the effects of the present invention are more excellent, a content of the monofunctional monomer is preferably 0.1% to 30% by mass, and more preferably 1% to 10% by mass with respect to the total mass of solid content in the photosensitive layer.

(Bifunctional Monomer)

From the reason that the effects of the present invention are more excellent, the above-described bifunctional monomer is preferably a compound having two ethylenically unsaturated groups. Specific examples of the above-described ethylenically unsaturated group are as described above.

Examples of the compound having two ethylenically unsaturated groups include glycol di(meth)acrylate compounds such as ethyleneglycol di(meth)acrylate, diethyleneglycol di(meth)acrylate, triethyleneglycol di(meth)acrylate, tetraethyleneglycol di(meth)acrylate, polyethyleneglycol di(meth)acrylate, propyleneglycol di(meth)acrylate, dipropyleneglycol di(meth)acrylate, tripropyleneglycol di(meth)acrylate, tetrapropyleneglycol di(meth)acrylate, polypropyleneglycol di(meth)acrylate, ethoxylated neopentylglycol di(meth)acrylate, and propoxylated neopentylglycol di(meth)acrylate;

divinyl ether compounds such as ethyleneglycol divinyl ether, diethyleneglycol divinyl ether, triethyleneglycol divinyl ether, propyleneglycol divinyl ether, dipropyleneglycol divinyl ether, butanediol divinyl ether, hexanediol divinyl ether, and cyclohexanedimethanol divinyl ether; and di(meth)acrylate compounds of bisphenol A such as bisphenol A diglycidyl ether (meth)acrylic acid adduct, modified bisphenol A di(meth)acrylate, bisphenol A PO-adducted di(meth)acrylate, and bisphenol A EO-adducted di(meth)acrylate.

PO represents propylene oxide and E0 represents ethylene oxide.

From the reason that the effects of the present invention are more excellent, a content of the bifunctional monomer is preferably 0.1% to 30% by mass with respect to the total mass of solid content in the photosensitive layer.

<Photopolymerization Initiator>

The photopolymerization initiator is not particularly limited, and examples thereof include photopolymerization initiators such as alkylphenones, acetophenones, benzoin ethers, benzophenones, thioxanthones, anthraquinones, benzyls, and biacetyls.

More specific examples thereof include benzyl dimethyl ketal, 2-hydroxy-2-methyl-1-phenyl-propan-1-one, methyl-o-benzoylbenzoate, and 1-hydroxycyclohexyl phenyl ketone.

From the viewpoint of sensitivity or the like, a content of the photopolymerization initiator is preferably 0.3% to 15% by mass and more preferably 0.5% to 10% by mass with respect to the total mass of solid content in the photosensitive layer.

In the present invention, from the reason that the rear end ink receptivity in a case of being used for a flexographic printing plate is improved, it is preferable that, in a case where the content (% by mass) of the above-described monomer contained in the above-described photosensitive layer is denoted as M and the content (% by mass) of the above-described photopolymerization initiator contained in the above-described photosensitive layer is denoted as I, the following condition C is satisfied.

$$15 \leq M \times I^{1/2} \leq 28 \quad \text{Condition C:}$$

<Polymerization Inhibitor>

Examples of the polymerization inhibitor include phenols, hydroquinones, and catechols.

From the reason that development scum dispersibility of a flexographic printing plate precursor after being stored for a long time is more excellent, a content of the polymerization inhibitor is preferably 0.01% by mass or more, more preferably 0.01% by mass or more and 5% by mass or less, and still more preferably 0.01% by mass or more and 0.5% by mass or less with respect to the total mass of solid content in the photosensitive layer.

<Telechelic Polymer>

From the reason that the effects of the present invention are more excellent, the photosensitive layer preferably contains a telechelic polymer.

In the present specification, the "telechelic polymer" means a polymer which has a reactive functional group at both terminals.

(Main Chain)

A polymer constituting a main chain of the telechelic polymer is not particularly limited, and examples thereof include a thermoplastic polymer.

The thermoplastic polymer is not particularly limited as long as the thermoplastic polymer is a polymer exhibiting thermoplasticity, and specific examples thereof include a polystyrene resin, a polyester resin, a polyamide resin, a polysulfone resin, a polyethersulfone resin, a polyimide resin, an acrylic resin, an acetal resin, an epoxy resin, a polycarbonate resin, rubbers, and a thermoplastic elastomer.

Among these, from the reason that more elastic and flexible film can be easily formed, a rubber or a thermoplastic elastomer is preferable, a rubber is more preferable, and a diene-based rubber is still more preferable.

Specific examples of the above-described rubber include butadiene rubber (BR), nitrile rubber (NBR), acrylic rubber, epichlorohydrin rubber, urethane rubber, isoprene rubber, styrene isoprene rubber, styrene butadiene rubber (SBR), ethylene-propylene copolymer, and chlorinated polyethylene. These may be used alone or in combination of two or more. Among these, from the reason that water developability is improved, or from the viewpoint of drying properties and image reproducibility, at least one rubber selected from the group consisting of butadiene rubber (BR), styrene butadiene rubber (SBR), and nitrile rubber (NBR) is preferable, and butadiene rubber or styrene butadiene rubber is more preferable.

Examples of the above-described thermoplastic elastomer include a polybutadiene-based thermoplastic elastomer (PB), a polyisoprene-based thermoplastic elastomer, a polyolefin-based thermoplastic elastomer, and an acrylic thermoplastic elastomer. Specific examples thereof include polystyrene-polybutadiene (SB), polystyrene-polybutadiene-polystyrene (SBS), polystyrene-polyisoprene-polystyrene (SIS), polystyrene-polyethylene/polybutylene-polystyrene (SEBS), acrylonitrile butadiene styrene copolymer (ABS), acrylic acid ester rubber (ACM), acrylonitrile-chlorinated polyethylene-styrene copolymer (ACS), acrylonitrile-styrene copolymer, syndiotactic 1,2-polybutadiene, and methyl polymethacrylate-butyl polyacrylate-methyl polymethacrylate. Among these, from the reason that water developability is improved, or from the viewpoint of drying properties and image reproducibility, PB, SBS, or SIS is particularly preferable.

(Terminal)

The telechelic polymer has a reactive functional group at both terminals.

The above-described reactive functional group is not particularly limited, but from the reason that the effects of the present invention are more excellent, an ethylenically unsaturated group is preferable.

From the reason that the effects of the present invention are more excellent, the above-described ethylenically unsaturated group is preferably a vinyl group ($CH_2$=CH—), an allyl group ($CH_2$=CH—$CH_2$—), a (meth)acryloyl group, or a (meth)acryloyloxy group, and more preferably a (meth)acryloyloxy group.

The telechelic polymer may have a reactive functional group at both terminals of the polymer constituting the main chain through a divalent linking group.

The above-described divalent linking group is not particularly limited, and examples thereof include a linear, branched, or cyclic divalent aliphatic hydrocarbon group (for example, an alkylene group such as a methylene group, an ethylene group, and a propylene group), a divalent aromatic hydrocarbon group (for example, a phenylene group), —O—, —S—, —$SO_2$—, —NRL-, —CO—, —NH—, —COO—, —CONRL-, —O—CO—O—, —$SO_3$—, —NHCOO—, —$SO_2$NRL-, —NH—CO—NH—, and a group in which two or more of these groups are combined (for example, an alkyleneoxy group, an alkyleneoxycarbonyl group, an alkylenecarbonyloxy group, and the like). Here, RL represents a hydrogen atom or an alkyl group (preferably having 1 to 10 carbon atoms).

(Molecular Weight)

From the reason that the effects of the present invention are more excellent, a weight-average molecular weight (Mw) of the telechelic polymer is preferably 6,000 or more, more preferably 7,000 or more, still more preferably 8,000 or more, and particularly preferably 9,000 or more. The upper limit of Mw of the telechelic polymer is not particularly limited, but from the reason that the effects of the present invention are more excellent, it is preferably 500,000 or less and more preferably 100,000 or less.

Here, the weight-average molecular weight is measured by a gel permeation chromatograph method (GPC) and is obtained by converting with standard polystyrene. Specifically, for example, HLC-8220 GPC (manufactured by Tosoh Corporation) is used as GPC, three of TSKgeL SuperHZM-H, TSKgeL SuperHZ4000, and TSKgeL SuperHZ2000 (all manufactured by Tosoh Corporation, 4.6 mmID×15 cm) are used as a column, and tetrahydrofuran (THF) is used as an eluent. In addition, as the conditions, a sample concentration of 0.35% by mass, a flow rate of 0.35 mL/min, a sample injection amount of 10 μL, and a measurement temperature of 40° C. are set, and an IR detector is used. In addition, a calibration curve is created using 8 samples of "F-40", "F-20", "F-4", "F-1", "A-5000", "A-2500", "A-1000", and "n-propylbenzene" which are "Standard Samples TSK standard, polystyrene" (manufactured by TOSOH Corporation).

(Hsp Value)

A Hansen solubility parameter (HSP) value of the telechelic polymer is not particularly limited, but from the reason that the effects of the present invention are more excellent, it is preferably 8 to 12, more preferably 8.5 to 11, and still more preferably 8.5 to 10.5.

(Content)

From the reason that the effects of the present invention are more excellent, a content of the telechelic polymer is preferably 1% to 50% by mass, more preferably 5% to 40% by mass, still more preferably 7% to 30% by mass, and particularly preferably 10% to 20% by mass with respect to the total mass of solid content in the photosensitive layer.

<Plasticizer>

From the reason that flexibility is improved, the photosensitive layer preferably contains a plasticizer.

Specific examples of the plasticizer include liquid rubber, oil, polyester, and phosphoric acid-based compounds.

Specific examples of the liquid rubber include liquid polybutadiene, liquid polyisoprene, and compounds in which these compounds are modified with maleic acid or an epoxy group.

Specific examples of the oil include paraffin, naphthene, and aroma.

Specific examples of the polyester include adipic acid-based polyester.

Specific examples of the phosphoric acid-based compound include phosphoric acid ester.

From the reason that the flexibility is further improved, a content of the plasticizer is preferably 0.1% to 40% by mass, and more preferably 5% to 30% by mass with respect to the total mass of solid content in the photosensitive layer.

<Surfactant>

From the viewpoint of improving the water developability, the photosensitive layer preferably contains a surfactant.

Examples of the surfactant include a cationic surfactant, an anionic surfactant, and a nonionic surfactant. Among these, from the reason that the effects of the present invention are more excellent, an anionic surfactant is preferable.

Specific examples of the anionic surfactant include aliphatic carboxylates such as sodium laurate, and sodium oleate;

- higher alcohol sulfate salts such as sodium lauryl sulfate, sodium cetyl sulfate, and sodium oleyl sulfate;
- polyoxyethylene alkyl ether sulfate ester salts such as sodium polyoxyethylene lauryl ether sulfate;
- polyoxyethylene alkyl allyl ether sulfate ester salts such as sodium polyoxyethylene octyl phenyl ether sulfate and sodium polyoxyethylene nonyl phenyl ether sulfate;
- alkyl sulfonates such as alkyl diphenyl ether disulfonate, sodium dodecyl sulfonate, and sodium dialkyl sulfosuccinate;
- alkyl allyl sulfonates such as alkyl disulfonate, sodium dodecyl benzene sulfonate, sodium dibutyl naphthalene sulfonate, and sodium triisopropyl naphthalene sulfonate;
- higher alcohol phosphate ester salts such as disodium lauryl phosphate monoester, and sodium lauryl phosphate diester; and
- polyoxyethylene alkyl ether phosphate ester salts such as disodium polyoxyethylene lauryl ether phosphate monoester, and sodium polyoxyethylene lauryl ether phosphate diester.

These may be used alone or in combination of two or more.

Among these, from the reason that the water developability is further improved, sulfonic acid-based surfactants such as alkyl sulfonate and alkyl allyl sulfonate are preferable.

From the viewpoint of developability and drying properties after development, a content of the surfactant is preferably 0.1% to 20% by mass, and more preferably 1% to 10% by mass with respect to the total mass of solid content in the photosensitive layer.

<Other Additives>

To the extent that the effects of the present invention are not impaired, other additives such as an ultraviolet absorber, a dye, a pigment, an anti-foaming agent, and a fragrance can be appropriately added to the photosensitive layer, for the purpose of improving various properties.

As described above, the flexographic printing plate precursor according to the embodiment of the present invention can exhibit excellent rear end ink receptivity and microcell reproducibility in a case of being used for a flexographic printing plate.

Although the details thereof are not clear, the present inventors have presumed as follows.

First, in order to obtain the microcell reproducibility, it is necessary to increase the main exposure amount as much as possible, but in a case where the main exposure amount is too large, since the monomer moves from the non-exposed portion to the end part as the exposed portion, polymerization progresses, and the convex portion (with the end part raised) is formed at the end part as the exposed portion, so that the rear end ink receptivity is deteriorated.

Therefore, in the present invention, by adjusting the contents of the monomer, the photopolymerization initiator, and the polymerization inhibitor and by satisfying the above-described conditions A and B, the amount of monomer moving the end part as the exposed portion is reduced in the main exposure, and as a result, it is considered that the polymerization at the end part as the exposed portion is suppressed, a sufficient main exposure amount can be applied, and the rear end ink receptivity and the microcell reproducibility can be obtained.

<Method for Producing Photosensitive Layer>

A method for producing the photosensitive layer is not particularly limited, and examples thereof include a method of preparing a composition (photosensitive resin composition) containing each of the above-described components and applying the composition to a substrate or the like.

[Suitable Aspect]

From the reason that the effects of the present invention are more excellent, the printing plate precursor according to the embodiment of the present invention is preferably a so-called analog type printing plate precursor in which a negative film (film on which an image is already formed) is closely attached to the photosensitive layer at the time of use, or a laser ablation mask (LAM) type printing plate precursor, in which an infrared ablation layer is closely attached to the photosensitive layer in advance, the LAM type being included in a so-called computer to plate (CTP) type.

From the reason that the effects of the present invention are more excellent, it is preferable that the analog type printing plate precursor is a printing plate precursor in which an adhesive layer composed of an adhesive or the like which adheres the support and the photosensitive layer, the above-described photosensitive layer, an anti-adhesion layer to prevent the surface of the photosensitive layer from adhering, and a protective film preventing scratches on the photosensitive layer before use are laminated on the support in this order.

Specific examples of the support include plastic films such as a polyethylene terephthalate (PET) film or plastic sheets; metal sheets such as stainless steel and aluminum; and rubber sheets such as butadiene rubber.

In the analog type printing plate precursor, the protective film is peeled off at the time of use, and the negative film on which an image is formed in advance is closely attached to the exposed anti-adhesion layer.

The analog type printing plate precursor can be manufactured by, for example, applying an adhesive in advance to one surface of the support and applying an anti-adhesion agent in advance to one surface of the protective film, interposing the above-described photosensitive resin composition between a substrate to which the adhesive is applied in advance and a protective film to which the anti-adhesion agent is applied in advance, and pressing the printing plate precursor such that a thickness of the photosensitive layer is a predetermined thickness.

The LAM type printing plate precursor is different from the analog type printing plate precursor in that the LAM type printing plate precursor has an infrared ablation layer between the photosensitive layer and the protective film, and other configurations are the same as the analog type printing plate precursor. That is, the adhesive layer, the photosensitive layer, the infrared ablation layer, and the protective film are laminated on the support in this order. In the LAM type printing plate precursor, the protective film is peeled off at the time of use to expose the infrared ablation layer.

The infrared ablation layer is a layer capable of removing a portion irradiated by an infrared laser, and the infrared ablation layer itself is a layer which also has a function of blocking the transmission of ultraviolet rays at a practical level. By forming an image on the infrared ablation layer, the infrared ablation layer can serve as a negative film or a positive film.

The infrared ablation layer is mainly composed of a binder such as resin and rubber, an infrared absorbing substance, an ultraviolet absorbing substance, a plasticizer, and the like. The infrared ablation layer can be manufactured by, for example, dissolving the above-described materials in a solvent, applying the solution to a base material, and drying the solution to remove the solvent.

The LAM type printing plate precursor can be manufactured by, for example, applying an adhesive in advance to one surface of the support and coating one surface of the protective film with an infrared ablation layer in advance, interposing the above-described photosensitive resin composition between the support to which the adhesive is applied in advance and the protective film which is coated with the infrared ablation layer in advance, and pressing the printing plate precursor such that a thickness of the photosensitive layer is a predetermined thickness.

In any of the printing plate precursors, from the reason that the effects of the present invention are more excellent, the thickness of the photosensitive layer is preferably in a range of 0.01 to 10 mm. In a case where the thickness of the photosensitive layer is 0.1 mm or more, a sufficient relief depth can be secured.

[Flexographic Printing Plate]

The flexographic printing plate according to the present invention (hereinafter, also abbreviated as "printing plate according to the present invention") is a flexographic printing plate having an image area and a non-image area.

Here, the above-described image area is an image area obtained by imagewise exposing and developing the photosensitive layer included in the above-described printing plate precursor according to the embodiment of the present invention.

From the reason that rear end ink receptivity and microcell reproducibility are more excellent, the printing plate according to the present invention is preferably obtained by the following method.

In order to form a relief image on the photosensitive layer of the printing plate precursor, first, ultraviolet irradiation is performed on the substrate side of the printing plate precursor (back exposure).

In a case of using the analog type printing plate precursor, the protective film is peeled off, and the negative film on which an image is formed in advance is closely attached to the exposed anti-adhesion layer. On the other hand, in a case of using the LAM type printing plate precursor, the protective film is peeled off, and a desired image is formed by, for example, irradiating the exposed infrared ablation layer with an infrared laser.

Next, the photosensitive layer is cured by irradiating ultraviolet rays from above the negative film or the infrared ablation layer (main exposure). The ultraviolet rays can be usually irradiated from a high-pressure mercury lamp, an ultrahigh-pressure mercury lamp, a metal halide lamp, a xenon lamp, a carbon arc lamp, a chemical lamp, and the like, which can perform irradiation with light having a wavelength of 300 to 400 nm. An irradiated portion of the photosensitive layer is cured by irradiation with ultraviolet rays. The photosensitive layer covered with the negative film or the infrared ablation layer has a cured portion irradiated with ultraviolet rays and an uncured portion not irradiated with ultraviolet rays.

Next, the relief image is formed by removing the uncured portion of the photosensitive layer in the developer. A water-based developer (aqueous developer) is used as the developer. The aqueous developer is composed of water to which a surfactant, a pH adjuster, or the like is added as necessary. The uncured portion of the photosensitive layer can be removed by, for example, washing out the uncured portion using a spray type developing device or a brush-type washing machine.

Next, the printing plate material is taken out from the developer and dried. Next, the entire dried printing plate material is irradiated with ultraviolet rays as necessary (post exposure). As a result, a flexographic printing plate is obtained.

EXAMPLES

Hereinafter, the present invention will be described in more detail with reference to examples. Materials, amounts used, ratios, treatment contents, treatment procedures, and the like shown in the following examples can be appropriately changed without departing from the spirit of the present invention. Therefore, the scope of the present invention should not be construed as being limited by the following examples.

[Preparation of Synthetic Latex 1]

465.0 g of water-dispersible latex (Nipol LX111NF, water-dispersible latex of polybutadiene, solid content: 55%, manufactured by Zeon Corporation) and 327.5 g of distilled water were added to a 1 L three-neck flask, and the temperature was raised to 75° C. with stirring under a nitrogen stream. After 30 minutes, an aqueous solution in which 4.9 g of 2,2'-azobis[N-(2-carboxyethyl)-2-methylpropionamidine] tetrahydrate (VA-057, manufactured by FUJIFILM Wako Chemicals Corporation) as a water-soluble azo polymerization initiator had been dissolved in 65.0 g of distilled water was added thereto at once. After 3 hours, the mixture was allowed to cool to room temperature (23° C.).

Next, the mixture was filtered through a non-woven filter paper (T-270, manufactured by ADVANTEC Co., Ltd.) to remove aggregates, thereby preparing a synthetic latex 1 having a concentration of solid contents of 30% by mass.

[Preparation of Synthetic Latex 2]

511.5 g of NBR latex (A-7137, water-dispersible latex of styrene-butadiene copolymer, solid content: 50% by mass, manufactured by Asahi Kasei Co., Ltd.) and 327.5 g of distilled water were added to a 1 L three-neck flask, and the temperature was raised to 75° C. with stirring under a nitrogen stream. After 30 minutes, an aqueous solution in which 4.9 g of 2,2'-azobis[N-(2-carboxyethyl)-2-methylpropionamidine] tetrahydrate (VA-057, manufactured by FUJIFILM Wako Chemicals Corporation) as a water-soluble azo polymerization initiator had been dissolved in 65.0 g of distilled water was added thereto at once. After 3 hours, the temperature was raised to 90° C., and after another 6 hours, the mixture was allowed to cool to room temperature (23° C.).

Next, the mixture was filtered through a non-woven filter paper (T-270, manufactured by ADVANTEC Co., Ltd.) to remove aggregates, thereby preparing a synthetic latex 2 having a concentration of solid contents of 30% by mass.

[Preparation of Synthetic Latex 3]

505 g of NBR latex (Nipol SX1503A, water-dispersible latex of acrylonitrile-butadiene copolymer, solid content: 43% by mass, manufactured by Zeon Corporation) and 150 g of distilled water were added to a 1 L three-neck flask, and the temperature was raised to 75° C. with stirring under a nitrogen stream. After 30 minutes, an aqueous solution in which 4.9 g of 2,2'-azobis[N-(2-carboxyethyl)-2-methylpropionamidine] tetrahydrate (VA-057, manufactured by FUJIFILM Wako Chemicals Corporation) as a water-soluble azo polymerization initiator had been dissolved in 65.0 g of distilled water was added thereto at once. After 3 hours, the temperature was raised to 90° C., and after another 6 hours, the mixture was allowed to cool to room temperature (23° C.).

Next, the mixture was filtered through a non-woven filter paper (T-270, manufactured by ADVANTEC Co., Ltd.) to remove aggregates, thereby preparing a synthetic latex 3 having a concentration of solid contents of 30% by mass.

[Manufacturing of Flexographic Printing Plate Precursor]

Flexographic printing plate precursors of Examples and Comparative Examples were manufactured as follows. The manufactured flexographic printing plate precursor corresponds to the above-described LAM type printing plate precursor.

Example 1

[Preparation of Photosensitive Resin Composition]

135.7 parts by mass (nonvolatile content: 40.7 parts by mass) of water-dispersible latex (the synthetic latex 1, solid content: 30%), 1.3 parts by mass of isobornyl methacrylate (LIGHT ESTER IB-X, KYOEISHA CHEMICAL Co., LTD.), and 8.7 parts by mass of 1,9-nonanediol methacrylate (NK ESTER NOD-N, manufactured by Shin-Nakamura Chemical Co., Ltd.) were mixed with each other, moisture was evaporated for 3 hours in a dryer heated to 60° C. to obtain a mixture containing a polymer (corresponding to the above-described water-dispersible particles) obtained from the water-dispersible latex and a monomer.

The mixture, 29.1 parts by mass of butadiene rubber (NF35R, manufactured by Asahi Kasei Co., Ltd.), and 2.2 parts by mass of a surfactant (RAPISOL A-80, effective content: 90%, manufactured by NOF Corporation) were kneaded in a kneader set at 110° C. for 45 minutes. Thereafter, 0.1 parts by mass of a polymerization inhibitor (dibutylhydroxytoluene, manufactured by Tokyo Chemical Industry Co., Ltd.) and 3.1 parts by mass of a photopolymerization initiator (benzyl dimethyl ketal, manufactured by Tokyo Chemical Industry Co., Ltd.) were put into the kneader, and the mixture was kneaded for 5 minutes to obtain a photosensitive resin composition.

[Production of Laminate for Infrared Ablation Layer]

812 parts by mass of methyl isobutyl ketone was added to a mixture of 50 parts by mass of acrylic resin (Hi-pearl M-5000, manufactured by Negami Chemical Industrial Co., Ltd.), 50 parts by mass of an elastomer (Nipol DN-101, manufactured by Zeon Corporation), and 100 parts by mass of carbon black (MA-8, manufactured by Mitsubishi Chemical Corporation), and the mixture was mixed by stirring with blade. After dispersing the obtained mixed solution with a paint shaker, methyl isobutyl ketone was further added thereto so that the solid content was 15% by mass to obtain a polymer/carbon black dispersion liquid (coating solution for an infrared ablation layer).

Next, the coating solution for an infrared ablation layer was applied to one side of a PET film (protective film) having a thickness of 75 μm using a bar coater so that the thickness after drying was 1.0 Thereafter, by drying the film in an oven set at 140° C. for 5 minutes, a laminate (laminate for an infrared ablation layer) in which an infrared ablation layer was formed on the protective film was produced.

[Production of Flexographic Printing Plate Precursor]

An adhesive was applied to one side of a PET film (support) having a thickness of 125 μm to form an adhesive layer on the support. The photosensitive resin composition prepared as described above was sandwiched between the above-described adhesive layer and the infrared ablation layer of the laminate for an infrared ablation layer produced as described above, and the laminate was pressed with a press machine heated to 80° C. so that a thickness from a bottom surface of the support to a surface of the photosensitive layer in the flexographic printing plate precursor was 1.14 mm, thereby producing a flexographic printing plate precursor including the support, the adhesive layer, the photosensitive layer, the infrared ablation layer, and the protective film in this order.

[Manufacturing of Flexographic Printing Plate]

<Back Exposure Step>

The obtained flexographic printing plate precursor was back-exposed from a distance of 15 cm from the support side using an exposure device in which 15 40 W chemical lamps were arranged. In addition, an exposure amount at which a relief depth was 600 μm was determined. The results are shown in Table 2 below. A dial gauge (manufactured by Mitutoyo Corporation) was used for observing the relief depth.

<Negative Pattern Forming Step>

After performing the back exposure, the protective film was peeled off, and a negative pattern was formed on the infrared ablation layer using CDI Spark2530 manufactured by ESKO. As a microcell image used for the negative pattern, a microcell image MC WSI manufactured by ESKO, that is, an image having a 200 μm convex thin line (length: 3 cm) and a solid portion (1 cm square) was selected.

<Main Exposure Step>

After forming the negative pattern, using the above-described exposure device, the obtained flexographic printing plate precursor was main-exposed from a distance of 15 cm through the infrared ablation layer, and a main exposure amount at which the difference in height between the end part as the convex portion and the central part as the concave portion in the image area consisting of the 200 μm convex thin line, to be formed in the subsequent development step, reached 4 μm was determined. The results are shown in Table 2 below.

<Development Step>

After performing the main exposure, development was performed for 10 minutes using a brush-type washing machine (liquid temperature: 50° C.) containing an aqueous developer in which the concentration of detergent (additive-free dishwashing soap, manufactured by MIYOSHI SOAP CORPORATION) was adjusted to 0.5%. Thereafter, the obtained product was dried with hot air of 60° C. until the moisture was removed.

<Post-Exposure Step>

After performing the drying, using the above-described exposure device, exposure (post-exposure) of 7500 mJ/square centimeter was performed from a distance of 15 cm from the photosensitive layer side.

In this way, a flexographic printing plate was obtained.

Examples 2 and 10 and Comparative Examples 1 to 4

A flexographic printing plate precursor and a flexographic printing plate were manufactured according to the same procedure as in Example 1, except that the type of each component and the mass ratio (% by mass) with respect to the total mass of solid content in the photosensitive resin composition were changed to values shown in Table 1.

Ef (main exposure amount) and Eb (back exposure amount) in a case of manufacturing the flexographic printing plate are as shown in Table 2.

[Evaluation]

The obtained flexographic printing plate precursor and flexographic printing plate were evaluated as follows.

[Rear End Ink Receptivity]

The obtained flexographic printing plate was evaluated for rear end ink receptivity as follows.

A flexographic printing machine (TLF-270, manufactured by TAIYO KIKAI Ltd.) was used as a printing machine. The obtained flexographic printing plate was attached to a plate cylinder (drum) through a cushion tape (manufactured by Lohmann), and installed in the printing machine. Thereafter, a kiss-touch (printing pressure at which the entire surface of the image started to be inked) was set to 0 (reference printing pressure), and from there, printing was performed at a printing speed of 150 m/min under the condition of pushing in 80 μm. A printed material used for the evaluation was pushed 5,000 times under the above-described conditions, and then sampled. As the printed material, a 50 μm OPP film (manufactured by ABE Paper Corporation) was used. In addition, as an ink, water-based flexo ink HYDRIC FCF (manufactured by Dainichiseika Color & Chemicals Mfg. Co., Ltd.) was used. A rear end part of the image area in the printed material was observed with a 20× microscope (VHX-1000, manufactured by KEYENCE CORPORATION) and evaluated according to the following standard.

The results are shown in Table 2 below. Practically, A to C are preferable, A or B is more preferable, and A is still more preferable.

(Evaluation Standard)

A: there was no poor impression.

B: density at the rear end part was slightly low.

C: white spots were confirmed to be interrupted in the width direction of the rear end part.

D: white spots were confirmed over the entire surface in the width direction of the rear end part.

[Microcell Reproducibility]

The obtained flexographic printing plate was evaluated for microcell reproducibility as follows. Using a hybrid laser microscope OPTELICS (registered trademark) HYBRIDE (manufactured by Lasertec Corporation), a confocal measurement was performed on a surface of the solid image area of the flexographic printing plate in increments of 0.1 μm in height with a 50× Apo objective lens (high numerical aperture (high NA)) to obtain three-dimensional data. For the evaluation, a region of 300 μm in length and 300 μm in width was set as an evaluation range.

From the above-described observation image, 100 or more convex portions were observed, and the number of reproduced portions without chipping was determined.

Next, an image reproduction % was calculated by the following expression.

(Number of reproduced convex portions without chipping)/(Number of evaluations)×100

The evaluation was performed using the following standards.

The results are shown in Table 2 below. In order to obtain a printed article having a higher solid density, the image reproduction of the microcells is preferably A to C, more preferably A or B, and still more preferably A. In a case where the image reproduction was less than 80%, unevenness of the ink transferred to the printed article was large, and the solid density was deteriorated.

(Evaluation Standard)

A: image reproduction was 98% or more.

B: image reproduction was 90% or more and less than 98%.

C: image reproduction was 80% or more and less than 90%.

D: image reproduction was less than 80%.

[Water-Based Ink Resistance]

The obtained flexographic printing plate was evaluated for water-based ink resistance as follows.

A flexographic printing machine (manufactured by TAIYO KIKAI Ltd., TLF-270) was used as a printing machine. The obtained flexographic printing plate was attached to a plate cylinder (drum) through a cushion tape (manufactured by Lohmann), and installed in the printing machine. Thereafter, a kiss-touch (printing pressure at which the entire surface of the image started to be inked) was set to 0 (reference printing pressure), and from there, printing was performed at a printing speed of 150 m/min under the condition of pushing in 80 μm. A printed material used for the evaluation was sampled up to 25 km every 5 km under the above-described conditions. As the printed material, Aurora Coat 84.9 g/m$^2$ (manufactured by Nippon Paper Industries Co., Ltd.) was used. In addition, as an ink, water-based flexo ink HYDRIC FCF (manufactured by Dainichiseika Color & Chemicals Mfg. Co., Ltd.) was used.

The number of chippings in a 2% halftone dot image area in the printed material was measured. A printing distance in which 25 of 4746 halftone dots were chipped at the start was set as an end point, and a distance to the end point was evaluated according to the following standard.

The results are shown in Table 2 below. Practically, A to C are preferable, A or B is more preferable, and A is still more preferable.

(Evaluation Standard)

A: 25 km or more

B: 20 km or more and less than 25 km

C: 15 km or more and less than 20 km

D: less than 15 km

[Development Scum Dispersibility]

The obtained flexographic printing plate precursor was evaluated for development scum dispersibility after storage over time as follows.

From the viewpoint of performing accelerated evaluation over time, the obtained flexographic printing plate precursor was stored in an oven at 45° C. for 10 days.

Thereafter, the flexographic printing plate precursor was taken out from the oven, and exposed with an exposure device in which 15 40 W chemical lamps were arranged for 2 seconds from the substrate side from a distance of 15 cm (back exposure).

Thereafter, development was performed for any time so that the solid content of development scum (dispersion) was 7.0% by mass, in a brush-type washing machine (liquid temperature: 50° C.) containing an aqueous developer in which the concentration of detergent (additive-free dish-washing soap, manufactured by MIYOSHI SOAP CORPORATION) was adjusted to 0.5%. The solid content of the development scum was obtained by measuring 2.0 g of the aqueous developer used (hereinafter, also abbreviated as a "fatigue solution"), drying at 95° C. for 18 hours, and calculating solid content % in the fatigue solution from the weight change before and after drying.

Next, 50 cc of the fatigue solution was put into a 200 cc plastic container containing 50 cc of water in advance, the mixture was stirred and allowed to stand for 12 hours, and aggregates in the liquid were visually observed and evaluated according to the following standard.

The results are shown in Table 2 below. Practically, A to C are preferable, A or B is more preferable, and A is still more preferable.

(Evaluation Standard)

A: there were no large aggregates which could be visually identified.

B: slightly large aggregates which could be visually identified were generated.

C: small amount of large aggregates which could be visually identified was generated.

D: large amount of large aggregates which could be visually identified was generated.

TABLE 1

| | | | Example | | | | | | | | | | Comparative Example | | | |
|---|---|---|---|---|---|---|---|---|---|---|---|---|---|---|---|---|
| | | | 1 | 2 | 3 | 4 | 5 | 6 | 7 | 8 | 9 | 10 | 1 | 2 | 3 | 4 |
| Binder | Rubber | BR rubber | 29.1 | 28.9 | 29.0 | 28.5 | | 23.3 | 28.3 | 27.2 | 23.3 | 29.1 | 28.9 | 28.4 | 26.9 | 27.0 |
| | | SBR rubber | | | | | 29.1 | | | | | | | | | |
| | | NBR rubber | | | | | | | | | 5.8 | | | | | |
| | Thermoplastic elastomer | | | | | | | 5.8 | | | | | | | | |
| Water-dispersible particles | | BR latex | 40.7 | 40.5 | 40.7 | 39.9 | | 40.7 | 39.6 | 38.1 | 40.7 | 32.6 | 40.4 | 39.8 | 37.6 | 37.9 |
| | | SBR latex | | | | | 40.7 | | | | | | | | | |
| | | NBR latex | | | | | | | | | | 8.1 | | | | |
| Surfactant | | | 2 | 2 | 2 | 2 | 2 | 2 | 2 | 2 | 2 | 2 | 2 | 2 | 2 | 2 |
| Telechelic polymer | | | 15 | 15 | 15 | 15 | 15 | 15 | 15 | 15 | 15 | 15 | 15 | 15 | 15 | 15 |
| Monomer 1 | | | 1.3 | 1.3 | 1.3 | 1.3 | 1.3 | 1.3 | 1.6 | 1.9 | 1.3 | 1.3 | 1.3 | 1.3 | 1.8 | 2.0 |
| Monomer 2 | | | 8.7 | 8.7 | 8.7 | 8.7 | 8.7 | 8.7 | 10.4 | 12.6 | 8.7 | 8.7 | 8.7 | 8.7 | 12.2 | 13.0 |

TABLE 1-continued

| | Example | | | | | | | | | | Comparative Example | | | |
|---|---|---|---|---|---|---|---|---|---|---|---|---|---|---|
| | 1 | 2 | 3 | 4 | 5 | 6 | 7 | 8 | 9 | 10 | 1 | 2 | 3 | 4 |
| Photopolymerization initiator | 3.1 | 3.1 | 3.1 | 4.5 | 3.1 | 3.1 | 3.1 | 3.1 | 3.1 | 3.1 | 3.1 | 4.8 | 4.5 | 3.1 |
| Polymerization inhibitor | 0.1 | 0.5 | 0.2 | 0.1 | 0.1 | 0.1 | 0.01 | 0.01 | 0.1 | 0.1 | 0.6 | 0.05 | 0 | 0.008 |

Components in Table 1 are shown below.
BR rubber: NF35R (manufactured by Asahi Kasei Co., Ltd.)
SBR rubber: Tufdene 2100 (manufactured by Asahi Kasei Co., Ltd.)
NBR rubber: Nipol 1042 (manufactured by Zeon Corporation)
Thermoplastic elastomer: polybutadiene-based thermoplastic elastomer (RB810, manufactured by JSR Corporation)
BR latex: synthetic latex 1 described above (nonvolatile content: 30%)
SBR latex: synthetic latex 2 described above (nonvolatile content: 30%)
NBR latex: synthetic latex 3 described above (nonvolatile content: 30%)
Surfactant: anionic surfactant (RAPISOL A-80, manufactured by NOF Corporation)
Telechelic polymer: polybutadiene having acryloyloxy groups at both terminals (BAC-45, Mw = 10,000, manufactured by OSAKA ORGANIC CHEMICAL INDUSTRY LTD.)
Monomer 1: isobornyl methacrylate (LIGHT ESTER IB-X, manufactured by KYOEISHA CHEMICAL Co., LTD.)
Monomer 2: 1,9-nonanediol methacrylate (NK ESTER NOD-N, manufactured by Shin-Nakamura Chemical Co., Ltd.)
Photopolymerization initiator: benzyl dimethyl ketal (manufactured by Tokyo Chemical Industry Co., Ltd.)
Polymerization inhibitor: dibutylhydroxytoluene (manufactured by Tokyo Chemical Industry Co., Ltd.)

TABLE 2

| | | Example | | | | | | |
|---|---|---|---|---|---|---|---|---|
| | | 1 | 2 | 3 | 4 | 5 | 6 | 7 |
| Exposure | Ef: main exposure amount (mJ/cm$^2$) | 9600 | 10368 | 10240 | 9120 | 9600 | 9600 | 7360 |
| | Eb: back exposure amount (mJ/cm$^2$) | 480 | 864 | 640 | 304 | 480 | 480 | 352 |
| | R | 20 | 12 | 16 | 30 | 20 | 20 | 21 |
| | t (mm) | 1.14 | 1.14 | 1.14 | 1.14 | 1.14 | 1.14 | 1.14 |
| | M × I$^{1/2}$ | 17.6 | 17.6 | 17.6 | 21.2 | 17.6 | 17.6 | 21.1 |
| Evaluation | Rear end ink receptivity | A | A | A | A | A | A | A |
| | Microcell reproducibility | A | B | A | A | A | A | A |
| | Water-based ink resistance | B | B | B | B | B | B | B |
| | Development scum dispersibility | B | B | B | B | B | B | B |

| | | Example | | | Comparative Example | | | |
|---|---|---|---|---|---|---|---|---|
| | | 8 | 9 | 10 | 1 | 2 | 3 | 4 |
| Exposure | Ef: main exposure amount (mJ/cm$^2$) | 5008 | 9600 | 9600 | 12000 | 7904 | 2880 | 4800 |
| | Eb: back exposure amount (mJ/cm$^2$) | 304 | 480 | 480 | 1200 | 208 | 240 | 304 |
| | R | 16 | 20 | 20 | 10 | 38 | 12 | 16 |
| | t (mm) | 1.14 | 1.14 | 1.14 | 1.14 | 1.14 | 1.14 | 1.14 |
| | M × I$^{1/2}$ | 25.5 | 17.6 | 17.6 | 17.6 | 21.9 | 29.7 | 26.4 |
| Evaluation | Rear end ink receptivity | A | A | A | A | A | B | A |
| | Microcell reproducibility | B | A | A | D | D | D | D |
| | Water-based ink resistance | B | C | C | B | B | B | B |
| | Development scum dispersibility | B | B | B | B | B | D | D |

As can be seen from Table 2, the flexographic printing plate precursor satisfying the condition A (R: 12 or more and 30 or less) and the condition B (Ef: 5,000 or more) exhibited excellent rear end ink receptivity, microcell reproducibility, water-based ink resistance, and development scum dispersibility in a case of being used for the flexographic printing plate (Examples 1 to 10).

From the comparison between Examples, in Examples 1, 3 to 7, 9, and 10 in which the value of R was 16 or more and the value of Ef was 7,300 or more, more excellent microcell reproducibility was exhibited.

In addition, from the comparison between Examples, in Examples 1 to 8 in which NBR was not used for the binder and the water-dispersible particles, more excellent water-based ink resistance was exhibited.

On the other hand, in both Comparative Example 1 in which the above-described value of R was less than 12 and Comparative Example 2 in which the value of R was more than 30, the microcell reproducibility was insufficient.

In addition, in both Comparative Examples 3 and 4 in which the Ef was less than 5,000, the microcell reproducibility was insufficient. In addition, in Comparative Examples 3 and 4, since the content of the polymerization inhibitor was less than 0.01%, the development scum dispersibility was also deteriorated.

EXPLANATION OF REFERENCES

1: floor area
2: image area
3: end part
4: concave portion

What is claimed is:

1. A flexographic printing plate precursor comprising:

a support; and a photosensitive layer disposed above the support, wherein the photosensitive layer contains at least water-dispersible particles, a binder, a monomer, a photopolymerization initiator, and a polymerization inhibitor, and the flexographic printing plate precursor satisfies all of the following conditions A and B, Condition A: in a case where R=(Ef/Eb)×(t−0.6)/0.54, a value of R is 12 or more and 30 or less, Condition B: Ef is 5,000 or more, here, Eb is a back exposure amount (unit: mJ/square centimeter), and refers to an exposure amount at which a relief depth is 600 μm, Ef is a main exposure amount (unit: mJ/square centimeter), and refers to an exposure amount at which a difference in height between an end part as a convex portion and a central part as a concave portion in a case of forming an image area consisting of a 200 μm convex thin line reaches 4 μm, and t refers to a thickness of the flexographic printing plate precursor from a bottom surface of the support to a surface of the photosensitive layer.

2. The flexographic printing plate precursor according to claim 1, wherein, in a case where a content (% by mass) of the monomer contained in the photosensitive layer is denoted as M and a content (% by mass) of the photopolymerization initiator contained in the photosensitive layer is denoted as I, the following condition C is satisfied, $$15 \le M \times I^{1/2} \le 28. \quad \text{Condition C:}$$

3. The flexographic printing plate precursor according to claim 2, wherein the value of R indicated by the condition A is 16 or more and 30 or less.

4. The flexographic printing plate precursor according to claim 2, wherein a value of Ef indicated by the condition B is 7,300 or more.

5. The flexographic printing plate precursor according to claim 2, wherein the binder contains at least one type of non-fluid rubber.

6. The flexographic printing plate precursor according to claim 5, wherein the non-fluid rubber is at least one selected from the group consisting of natural rubber, isoprene rubber, butadiene rubber, styrene butadiene rubber, butyl rubber, and ethylene-propylene rubber.

7. The flexographic printing plate precursor according to claim 2, wherein the binder contains at least one type of thermoplastic elastomer.

8. The flexographic printing plate precursor according to claim 2, wherein the water-dispersible particles are composed of a polymer obtained by polymerizing at least one monomer selected from the group consisting of isoprene, butadiene, styrene, butyl, ethylene, propylene, acrylic acid ester, and methacrylic acid ester.

9. The flexographic printing plate precursor according to claim 2, wherein a content of the polymerization inhibitor is 0.01% by mass or more.

10. The flexographic printing plate precursor according to claim 2, wherein a content of the polymerization inhibitor is 0.01% by mass or more and 0.5% by mass or less.

11. The flexographic printing plate precursor according to claim 1, wherein the value of R indicated by the condition A is 16 or more and 30 or less.

12. The flexographic printing plate precursor according to claim 11, wherein a value of Ef indicated by the condition B is 7,300 or more.

13. The flexographic printing plate precursor according to claim 11, wherein the binder contains at least one type of non-fluid rubber.

14. The flexographic printing plate precursor according to claim 1, wherein a value of Ef indicated by the condition B is 7,300 or more.

15. The flexographic printing plate precursor according to claim 1, wherein the binder contains at least one type of non-fluid rubber.

16. The flexographic printing plate precursor according to claim 15, wherein the non-fluid rubber is at least one selected from the group consisting of natural rubber, isoprene rubber, butadiene rubber, styrene butadiene rubber, butyl rubber, and ethylene-propylene rubber.

17. The flexographic printing plate precursor according to claim 1, wherein the binder contains at least one type of thermoplastic elastomer.

18. The flexographic printing plate precursor according to claim 1, wherein the water-dispersible particles are composed of a polymer obtained by polymerizing at least one monomer selected from the group consisting of isoprene, butadiene, styrene, butyl, ethylene, propylene, acrylic acid ester, and methacrylic acid ester.

19. The flexographic printing plate precursor according to claim 1, wherein a content of the polymerization inhibitor is 0.01% by mass or more.

20. The flexographic printing plate precursor according to claim 1, wherein a content of the polymerization inhibitor is 0.01% by mass or more and 0.5% by mass or less.

* * * * *